(12) United States Patent  (10) Patent No.: US 8,394,679 B2
Eaton et al.  (45) Date of Patent: Mar. 12, 2013

(54) NANO-STRUCTURED GASKET FOR COLD WELD HERMETIC MEMS PACKAGE AND METHOD OF MANUFACTURE

(75) Inventors: Mark F Eaton, Austin, TX (US); Curtis Nathan Potter, Austin, TX (US); Andrew Miner, San Francisco, CA (US)

(73) Assignee: Stellarray, Inc., Austin, TX (US)

( * ) Notice: Subject to any disclaimer, the term of this patent is extended or adjusted under 35 U.S.C. 154(b) by 0 days.

(21) Appl. No.: 12/874,212

(22) Filed: Sep. 1, 2010

(65) Prior Publication Data

US 2011/0272796 A1 Nov. 10, 2011

Related U.S. Application Data

(63) Continuation-in-part of application No. 12/179,398, filed on Jul. 24, 2008, now abandoned, which is a continuation-in-part of application No. 11/139,960, filed on May 27, 2005, now Pat. No. 7,576,427.

(60) Provisional application No. 60/574,835, filed on May 28, 2004.

(51) Int. Cl.
   *H01L 21/00* (2006.01)
(52) U.S. Cl. ... 438/118; 438/121; 438/125; 257/E23.18; 257/E21.499; 257/E21.5

(58) Field of Classification Search ............ 438/115, 438/118, 121, 125; 257/E23.18, E21.499, 257/E21.5
See application file for complete search history.

(56) References Cited

U.S. PATENT DOCUMENTS

| 3,311,798 | A  | * | 3/1967  | Gray ............... | 257/695 |
| 4,477,828 | A  | * | 10/1984 | Scherer ........... | 257/687 |
| 5,459,923 | A  | * | 10/1995 | Montesano ...... | 29/874 |
| 6,777,263 | B1 | * | 8/2004  | Gan et al. ........ | 438/106 |
| 2002/0179921 | A1 | * | 12/2002 | Cohn ............... | 257/99 |
| 2004/0016568 | A1 | * | 1/2004  | Palanisamy ..... | 174/260 |
| 2004/0041507 | A1 | * | 3/2004  | Ito .................. | 313/292 |
| 2004/0056236 | A1 | * | 3/2004  | Li et al. .......... | 252/500 |
| 2006/0115323 | A1 | * | 6/2006  | Coppeta et al. .. | 403/270 |

FOREIGN PATENT DOCUMENTS

JP  03112154 A  *  5/1991

OTHER PUBLICATIONS

Technique for Obtaining an Environmentally Secure Adhesive Seal; IBM Technical Disclosure Bulletin, Dec. 1986, US.*

* cited by examiner

*Primary Examiner* — Jarrett Stark
(74) *Attorney, Agent, or Firm* — Hulsey, P.C.; William N. Hulsey, III; Michele Stewart

(57) ABSTRACT

A structure and method for cold weld compression bonding using a metallic nano-structured gasket is provided. This structure and method allows a hermetic package to be formed at lower pressures and temperatures than are possible using bulk or conventional thin-film gasket materials.

10 Claims, 5 Drawing Sheets

NANO-STRUCTURED GASKET FOR COLD WELD HERMETIC MEMS PACKAGE AND METHOD OF MANUFACTURE

CROSS REFERENCE TO RELATED APPLICATIONS

The present U.S. Utility Patent Application claims priority pursuant to 35 U.S.C. §120, as a continuation in part, to the following U.S. Utility Patent Application which is hereby incorporated herein by reference in its entirety and made part of the present U.S. Utility Patent Application for all purposes:

I. U.S. Utility Application Ser. No. 12/179,398, entitled "COLD WELD HERMETIC MEMS PACKAGE AND METHOD OF MANUFACTURE," filed Jul. 24, 2008 now abandoned, which claims priority pursuant to 35 U.S.C. §120, as a continuation-in-part (CIP), to the following U.S. Utility Patent Application which is hereby incorporated herein by reference in its entirety and made part of the present U.S. Utility Patent Application for all purposes:

a. U.S. Utility Application Ser. No. 11/139,960, entitled "COLD WELD HERMETIC MEMS PACKAGE AND METHOD OF MANUFACTURE," filed May 27, 2005 now U.S. Pat. No. 7,576,427, patented, which claims priority pursuant to 35 U.S.C. §119(c) to the following U.S. Provisional Patent Application which is hereby incorporated herein by reference in its entirety and made part of the present U.S. Utility Patent Application for all purposes:

b. U.S. Provisional Application Ser. No. 60/574,835, entitled "COLD WELD HERMETIC MEMS PACKAGE AND METHOD OF MANUFACTURE,", filed May 28, 2004.

STATEMENT REGARDING FEDERALLY FUNDED RESEARCH AND DEVELOPMENT

This invention was supported in part by U. S. National Science Foundation grant 011-0539799

BACKGROUND OF THE INVENTION

This invention relates generally to the hermetic packaging of microdevices including semiconductor devices, hybrid devices, vacuum microelectronic devices, Micro Electro Mechanical System (MEMS) and Nano Electro Mechanical System (NEMS) devices. The substance of the invention is the use of a gasket made of metallic particles with a mean diameter under 200 nanometers and compression bonding with enough force to create a hermetic cold weld in order to seal a cap and base for the microdevice in a vacuum or a rarefied atmosphere and at room temperature. The cold weld bond is sufficient to ensure adequate hermeticity during the operational lifetime of the device. The resulting yield strength of the cold weld bond is sufficient so as to avoid any other force retention devices. The use of the metallic nanoparticle gasket or perform allows the formation of the hermetic cold weld at lower pressures than is possible with conventional metallic thin-film gaskets. This is turn means that in-vacuum compression bonding can be used with caps and bases made of low yield strength materials such as silicon or silicon wafers.

Hermetic microdevice packages enjoy wide use in the semiconductor industry in applications where true hermeticity is required. Such hermeticity is required where ambient conditions outside of the package or variations in the ambient conditions might affect device performance. In the semiconductor industry, hermetic passivation layers have been developed and applied to the surfaces of sensitive devices in order to give a primary level of defense against ambient conditions. Some of these layers are adequately hermetic. In other instances, a hermetic package is required.

While there exist numerous examples of cold weld feasibility and hermeticity at the macroscopic scale as cited in this disclosure, a quantitative physical model is more elusive due to the complexity of the bond process. Material deformation is a key element for successful cold welding. It is normally characterized by a surface expansion at the interface of each material to be cold welded. N. Bay, Weld Journal, Vol 62, 1983, p.137, developed a bond strength model based on surface area expansion at the bonding interface and the bonding force normal to the interface. The model relies on the fracturing of a surface interface layer by material shear flow followed by sufficient force normal to the welding interface to force intimate atomic contact between the two members to be bonded. The ratio of bond strength of the stronger member to the yield stress of the weaker member is claimed to be proportional to the extrusion of metal through cracks in the surface layer plus the degree of surface area expansion that will provide the surface layer cracking.

The bond strength model proposed by Bay takes the form of a bond-strength/yield-stress ratio equated to a surface expansion, pressure, yield stress function as follows:

$$\frac{\sigma_b}{\sigma_0} = (1-\S)Y\frac{p-p_E}{\sigma_0} + \S\frac{Y-Y\ll}{1-Y\ll}\frac{p}{\sigma_0}$$

$\sigma_b$ Bond strength $\sigma_0$ Yield stress

§ Area of surface $Y$ Surface expansion $Y\ll$ Surface expansion at fracture $p$ Normal pressure $p_E$ Extrusion pressure Testing of this relationship has shown satisfactory correlation, (N. Bay, Trans. ASME Jour. Engn. Ind., Vol. 101, 1979), for aluminum to aluminum bonding over the surface expansion range of fractional millimeters.

An important distinction can be made between macroscopic and microscopic shear phenomena. Such distinction can call into question the validity of Bays' relationship for rough surfaces. In cases where there are microscopic asperities in the surfaces to be welded the surface expansion needed to cause welding of the asperities may be very much reduced. Thus there is an issue of how linear the relationship between p-pE and Y-Y' remains as a function of asperity size and density.

The relationship claimed by Bay identifies some of the key material properties that optimize bond strength and, by extension, vacuum hermeticity. It is clearly advantageous to maximize surface expansion and minimize surface interface layers that can interfere with intimate contact between the two members to be bonded. The bonding pressure normal to the welding surfaces should be maximized within the constraint of the yield strength of the materials to be bonded.

A common hermetic package consists of a package base with electrical feedthrus insulated from such base for the purpose of extracting electrical signals from the device inside the package. The sensitive active device is mounted on the package base and microwire bonds are made to connect the device output pads to the package base electrical feedthrus. Finally a cover or cap is attached to the base via a hermetic bonding technique which varies according to the package material and its preparation. Prior-art bonding techniques require some degree of heat application to insure a hermetic bond of cap to base.

The two most common techniques for hermetically bonding cap to base are cap welding and solder sealing. Cap welding is accomplished by passing a high weld current through a tip (often a small roller) which precesses around the rim of the cap/package assembly as it locally melts the two metal members together. The solder sealing technique utilizes a solder preform (commonly gold/tin eutectic solder) placed between a gold plated cap and base, followed by the application of a heated ring at nominally 320° C. to melt the solder and effect the hermetic seal. Both of these techniques result in a considerable amount of heat transmitted through the package base and to the active device. Although there are methods of reducing the amount of heat transfer to the active device, it is not possible to eliminate the device heating altogether.

MEMS devices which exhibit free-standing micro mechanical structures have been hermetically packaged using both cap welding and solder sealing. However, due to residual stress in free standing members and the extreme sensitivity of structure surfaces, heat can either totally destroy or drastically reduce the production yields of such MEMS devices, especially the more complex types. For such devices, a room temperature package sealing process would be of great benefit.

Room temperature hermetic sealing has been utilized in Ultra High Vacuum (UHV) equipment technology for a number of years and is pervasive in the art of that technology. U.S. Pat. No. 3,208,758, Carlson and Wheeler, describes a vacuum seal technique suitable for high temperature baking after a room temperature seal has been implemented. The patent is focused on large flanges used in UHV vacuum system assembly. A copper gasket seal is described wherein two mating vacuum parts structured with vertical and sloping cutting edges are swaged into the copper gasket to effect a vacuum seal. The high force required for the deformation of the copper is achieved by tightening a series of bolts and nuts around the periphery of a flange. A preferred shape of the cutting edge is disclosed although the force required to effect a vacuum tight seal is not disclosed. The assembly, including the copper gasket and cutting edge shape, has come to be known as a "conflat" type vacuum fitting and is in wide use in the vacuum equipment industry. It has not been applied to microdevice packaging. Additional embodiments of the basic "conflat" sealing technique can be found in U.S. Pat. No. 3,217,992, Glasgow, and U.S. Pat. No. 3,368,818, Asamaki, et. al., both describing alternative bolting attachment geometries to effect the metal seal. Neither patent addresses the possibility of applying the technique to seal MEMS or microdevice packages.

Macro-scale cold welding has also been used for many years. Cold weld sealing has been exploited for cryogenic applications, such as focal plane array device sealing and input/output signal connections, as is described in A. M. Fowler et. al., "Orion: The Largest Infrared Focal Plane Array in Production", National Optical Astronomy Observatory, NOAO Preprint Series, No 903. Cold welds may be made with materials having various tensile strengths. While low tensile strength materials require less pressure for the formation of the weld, they are more susceptible to deformation caused, for example, by later elevated temperature excursions. High tensile strength materials require higher pressures for the cold weld, but are less susceptible to later deformations. Once a weld is made with a moderate tensile strength material such as copper, the bond provides a yield strength close to the yield strength of the materials used.

Indium (melting point, MP=156° C.) has been used extensively as a cold weld material in cold temperature electronics, as is described in "NASA Technical Brief, Lewis Research Center Cleveland Ohio, June 1998". Indium cold weld bumps are used for cold electronics chip input-output connections. The pressures required for forming hermetic bonds are much lower than the yield strength of single crystal silicon. Due to its' low melting point, however, indium is limited in the degree of post bond temperature cycling that can be tolerated. While vacuum hermetic seals have been demonstrated using indium, the resulting yield strength of the sealed parts is low due to the low yield strength of indium (on order of 1000 PSI). Kyle, U.S. Pat. No. 6,413,800 utilizes indium as a cold weld sealant for micropackages but due to the low yield strength of indium he requires an epoxy sealant as an adjunct for a force retention means.

Cold welding of medium tensile strength materials such as copper, aluminum and gold has been employed for considerable time. So-called "butt" cold welding is used to join heavy wire and rod material (see "Dave Nichols, The Welding Institute, TWI website, "Cold Pressure Welding"). This technique applies much higher pressure than for solder systems and relies on substantial flow of the material at the butt ends—that is a lateral flow of up to 2 to 3 times the rod diameter while containing the circumference of the rod. Hand-operated cold welding tools (see for example "Huestis Industrial Corporation, Cold Pressure Welding Tools. 2002") are designed and used to cold weld nonferrous materials in the 0.08 to 1.20 mm range. While the cold welding of materials such as copper and aluminum is established art in these kinds of macro-scale applications, it has not been utilized in a MEMS or semiconductor micropackage. Furthermore, the pressures required are much higher than the yield strength of silicon, though they may be closer to the yield strength of some ceramics used as MEMS substrates.

It has been observed that metallic nanoparticles melt at substantially lower temperatures than the same metal in bulk form. For example, the melting point of gold in its bulk form is over 1050° C., while nanoparticles of gold melt below 450° C. This implies that a thermocompression curve showing the relationship between temperature and pressure in order to achieve a metallic weld is closer to the origin in the case of the nanoparticle form of the metal. If the temperature at which the weld takes place is constrained to be room temperature or some other temperature lower than that at which damage would occur to a MEMS device, then less pressure would be required to effect a cold weld with the nanoparticle form of a given metal as compared to its bulk form, including deposited thin films.

With recent advances in MEMS technology leading to more sophisticated devices, efforts are being made to develop suitable packaging technology, both for single MEMS die and packaging at the wafer level. For MEMS devices, packaging at the wafer level is particularly attractive due to the way they are fabricated. Virtually all MEMS devices comprise micro mechanical elements suspended in space. During the fabrication process, these elements must be supported by a sacrificial material, usually through several levels of processing until the end of the fabrication sequence. At the end of the sequence, the sacrificial material is removed, commonly by etching, leaving the micro mechanical members preserved in their design space. This step is known as the "release" process. It is clearly desirable from a cost point of view to perform this release process on a whole wafer rather than individual die. However, once release is performed, the MEMS devices cannot be singulated without the individual mechanical parts being damaged from singulation debris or becoming stuck together (called stiction). The die are also extremely sensitive to contamination during storage and any processing after release but before packaging. Interest has therefore grown in performing release and hermetic packaging at the wafer scale prior to die singulation.

Recent development work in MEMS packaging at the wafer scale has focused on bonding directly to the silicon or other substrate used to fabricate the MEMS. This includes anodic or fusion bonding using heat and high electric fields, eutectic bonding using heat to form a bond between gold or aluminum to silicon, and thermocompression bonding. A novel application of heat has been explored using a polysilicon resistance heater element embedded directly into the MEMS devices.

In U.S. Pat. No. 6,379,988 B1, Petersen and Conley describe a pre-release plastic packaging of MEMS devices wherein the device is encapsulated in a plastic package prior to release. The plastic package can be perforated to allow release in the package using wet or dry etching processes. In a final step, a cover lid is attached to the plastic package by various means common in prior art.

U.S. Pat. No. 6,400,009 B1, Bishop, et al, discloses a MEMS package and bonding means employing a firewall to form a protective cavity for the MEMS device during heat sealing of top and bottom members of the package. Electrical feedthrus that penetrate the firewall may be made of polysilicon conductive material encapsulated with silicon dioxide. All structures disclosed are fabricated concurrently with the MEMS device. An integral plurality of solder bumps is claimed as a means of strengthening the solder bonded parts. The sealing means described is heated solder sealing.

U.S. Pat. No. 6,627,814B1, David H. Stark, discloses a package with a continuous sidewall with a top surface prepared for solder sealing. A transparent window forms a top cover. The window is prepared with an outer metallic frame suitable for soldering to the base. The solder method requires the application of heat above the melting temperature of the solder.

U.S. Pat. No. 6,639,313 B1, Martin and Harney, discloses a ceramic package with a recess for holding an optical MEMS mirror device. A glass window cover is disclosed which is heat solder-sealed to the ceramic substrate by means of a flexible, folded metal interposer disposed peripherally around the edge of the glass window and ceramic base. Uniquely, the folded metal interposer allows the difference in expansion and contraction between the window and the ceramic to be mitigated during heat cycling. Hermeticity is achieved by heat soldering.

U.S. Pat. No. 6,413,800, Kyle, teaches a cold weld hermetic packaging method in which a metal seal member is disposed on the base of a device package and an organic sealant is placed along the outside of the base outside the metal seal member, or in a variation, on top of the metal seal member. The lid or cap of the package is then pressed onto said sealing structure to form a hermetic seal at room temperature. The metal seal member is made of indium which Kyle teaches is slightly deformed by the pressing of the cap. A preferred organic sealant is epoxy which can later be cured to hardness by the application of UV light. The organic sealant serves two purposes. The first is to apply further lateral pressure to the metal seal as the organic sealant shrinks during the curing process. The second is to hold the seal together during the operational lifetime of the package, eg., force retention. Kyle teaches that neither the metal seal nor the organic sealant are sufficient in themselves to provide a durable hermetic seal. The soft indium metal provides only a weak hermetic seal and is unable to hold the package together without the additional holding force of the organic sealant. The organic sealant by itself would outgas contaminants into the package and allow moisture to leak in, and would therefore not provide a true hermetic seal.

OBJECTS AND ADVANTAGES OF THE INVENTION

The object of this invention is to provide a means of hermetically sealing a microdevice at room temperature, or moderately elevated temperature such that the functioning of the microdevice is not adversely affected, by compressing together the device base, a cap for the device and a metallic nanoparticle gasket between said base and cap so as to effect a cold weld for the device package, the aforesaid operation taking place in a vacuum, inert gas or other environment which is thereby captured inside the device package.

Another object of the invention is to form a cold weld that will have sufficient strength to maintain the force required to keep the package and base hermetically sealed after the compressive force is removed.

Another object of the invention is to form a cold weld using gasket materials with sufficient yield strength to maintain the force required to keep the package and base hermetically sealed after the compressive force is removed, this force being lower than that which would crack or deform common device base materials, such as silicon substrates.

Another object of the invention is to form cold welds for a multiplicity of devices using the silicon or other substrate on which they were made as the package base.

Another object of the invention is to form axial interconnect structures, for example electrical or optical input and output connections, as part of such seal ring so as to provide axial feed-throughs after the cold weld compression operation.

Another object of the invention is to provide a means to apply a high electric field at the sealing interface between cap and base so as to induce metal migration of seal materials, thereby enhancing the cold weld and allowing cold welds at lower physical pressures.

Another object and advantage of the invention is to form a hermetic seal at room temperature with such seal exhibiting a leak rate of less than $10^-9$ Torr linter/sec.

A specific advantage of the invention is a method of room temperature hermetic sealing of MEMS devices which exhibit sensitivity to heat cycling during the sealing operation.

Another advantage of the invention is very high throughput sealing, since only a single compression step is required to make a hermetic seal. No heat cycling with attendant solder melt or welding dwell times is required. Wafer-scale sealing of a multiplicity of devices may also be performed Another advantage of the invention is its application to microdevices or nano-devices other than MEMS such as NEMS, hybrid assemblies, vacuum microelectronic devices and semiconductor devices which may require a high degree of hermeticity.

BRIEF SUMMARY OF THE INVENTION

The invention disclosed herein provides a structure and method for cold weld compression bonding using a metallic nano-structured gasket which allows a hermetic package to be formed at lower pressures and temperatures than are possible using bulk or conventional thin-film gasket materials.

The invention can be extended to wafer scale packaging of MEMS and other microdevices through the fabrication of suitable structures for cap attachment during the fabrication sequence for the MEMS or microdevices.

The metallic nanoparticles used to form the gasket may be made using a variety of prior art techniques and then formed on the device base or cap using settling, electrophoretic deposition, ink jet printing or other methods, or the metallic nanoparticles be formed in situ in a chamber attached to the chamber used in the compression operation.

DETAILED DESCRIPTION OF THE INVENTION

Although the following detailed description delineates many specific attributes of the invention and describes specific fabrication procedures, those skilled in the art of microfabrication will realize that many variations and alterations in the fabrication details and the basic structures are possible without departing from the generality of the processes and structures. The most general attributes of the invention relate to a structure and method of making a hermetic seal between a microdevice package base and cap at room temperature. The specific novelty of the invention is found in the use of a metallic nano-structured gasket on cap or base which lowers the pressure required at a given temperature for higher yield strength solder materials to be used in a cold weld package sealing application.

Figure 1A:
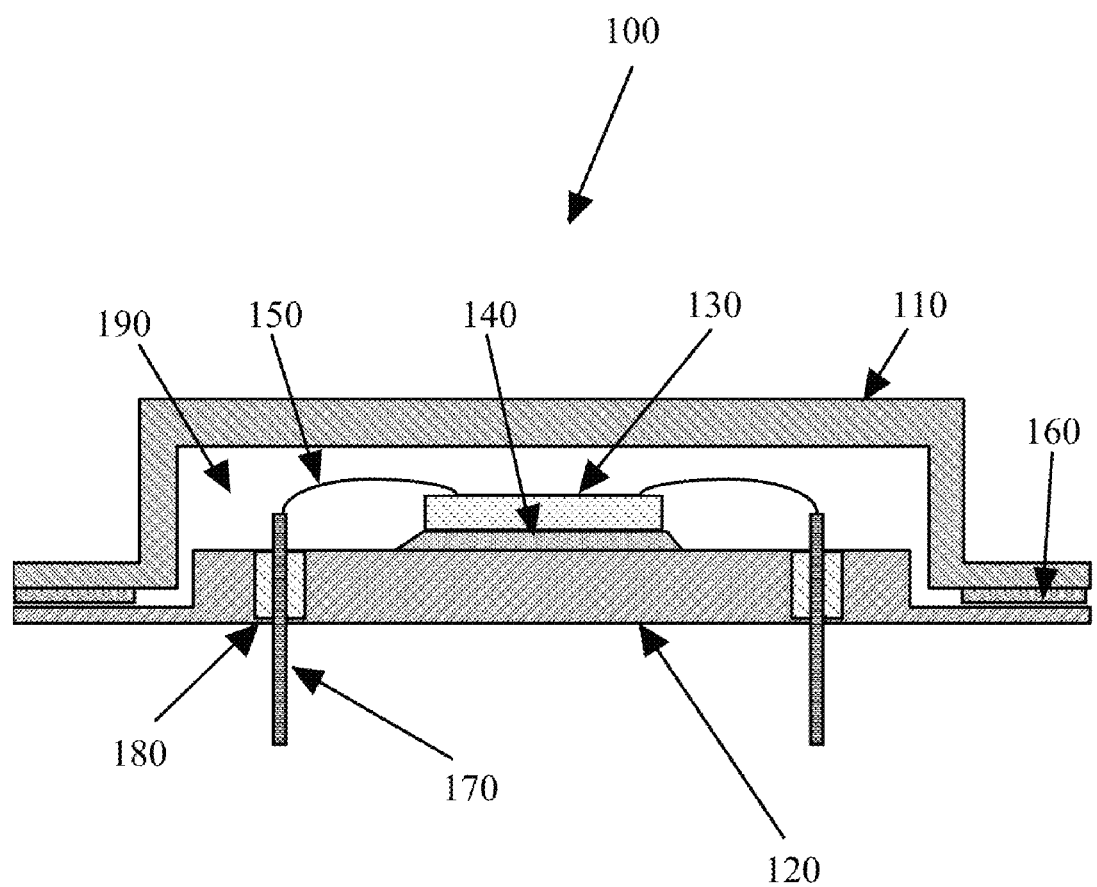
FIG. 1a shows a prior art sealing technology for attaching a package cap to a base by solder sealing means.
Figure 1B:
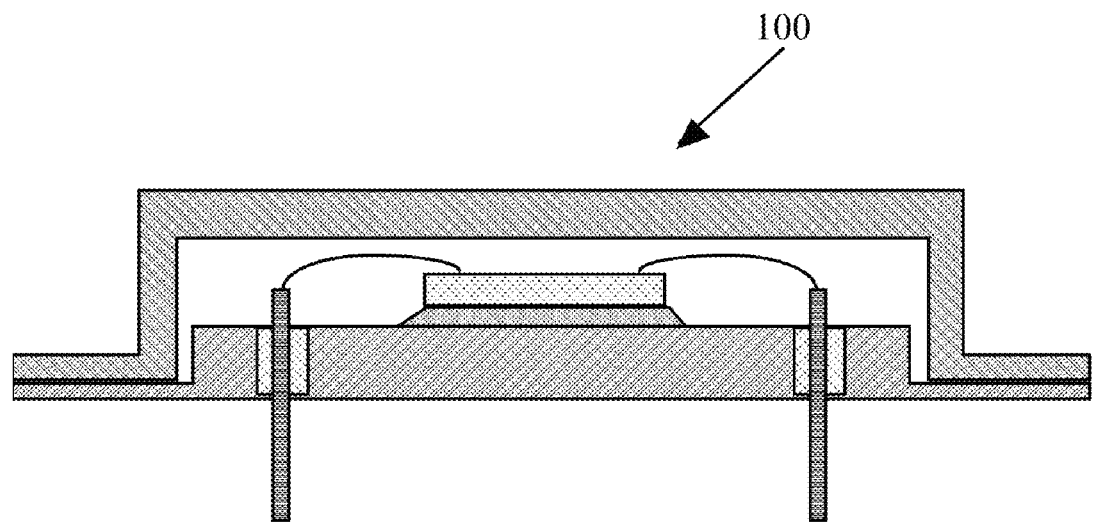
FIG. 1b shows a prior art sealing technology for attaching a package cap to a base by welding means.
Figure 2:
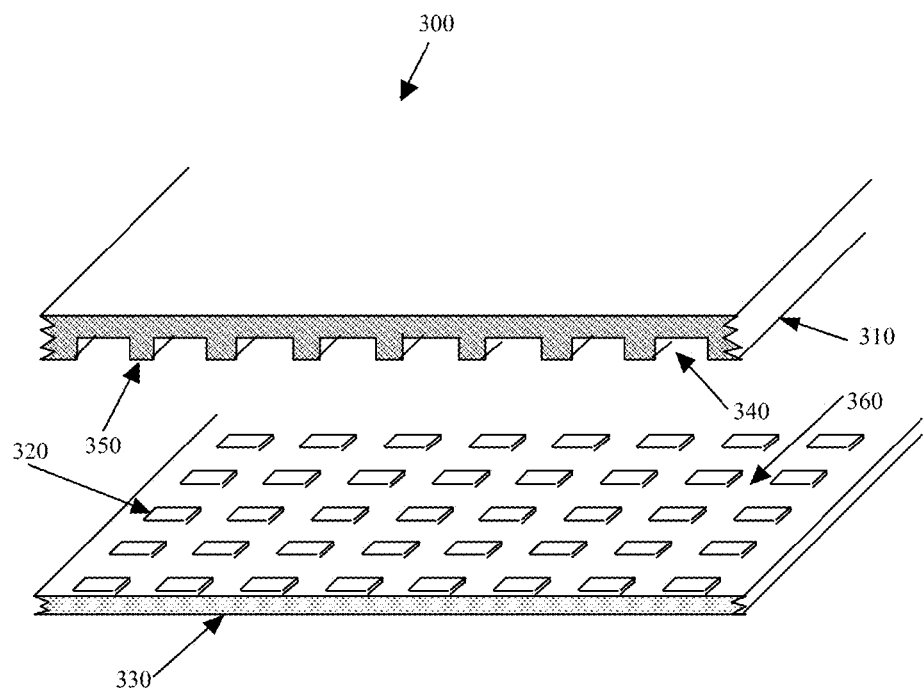
FIG. 2 shows a prior art wafer scale packaging technology where an entire wafer is capped and sealed at once using anodic, fusion, covalent or eutectic bonding.

Extensive prior art in the packaging of microdevices is shown in FIGS. 1 and 2. FIG. 1 delineates a hypothetical MEMS device 130 mounted on package base 120 with electrical feedthrus 170 penetrating the base and insulated from the base by insulator 180. MEMS device 130 is attached to the base 120 using material 140 which may typically be solder or organic adhesive. Wire bonds 150 connect the MEMS device electrically to feedthrus 170. MEMS die 130 may be released from its temporary support either as a singulated die before mounting on the package base or after mounting on the base. The MEMS device may also be tested after mounting on the base in an appropriate environment of rarefied gas or in vacuum. Package cap 110 is conventionally attached using heat soldering with solder preform 160 or can be hot weld sealed directly cap to base without solder as shown in FIG. 1b. The package base and cap will typically be metal (often kovar) and be plated with a solderable metal in the case of solder sealing. After sealing, the space 190 is hermetic and the atmosphere during sealing is trapped therein and thus constitutes the operational ambient during the life of the device. There are a number of variations on this single package assembly relating to the method of MEMS die attach, configuration of the electrical feedthrus in the base and package profile variation as a function of how the package is attached at the PC board level. All variations are well documented in prior art.

Another prior art wafer scale packaging technique is shown in FIG. 2. An array of MEMS die 320 can be released from the temporary support at the wafer scale. A portion of a larger array of MEMS die is shown on substrate 330. The die are separated by wide scribe lines 360. An entire matching substrate, a portion of which is shown in FIG. 2, 310 can be bonded to substrate 330 by pressure and electric field application (called anodic or fusion bonding). Covalent or eutectic solder bonding can also be utilized. Cavities 340 formed in the extended cap substrate provide space for the MEMS devices after bonding. However, for the process to function at a high level of yield, the matching substrates must be very flat for intimate contact everywhere and the cap and base material system must be amenable to such a process. Silicon substrates are commonly used with silicon caps. After wafer scale bonding, the die can be singulated by sawing without damage to the active MEMS devices.

Figure 3A:
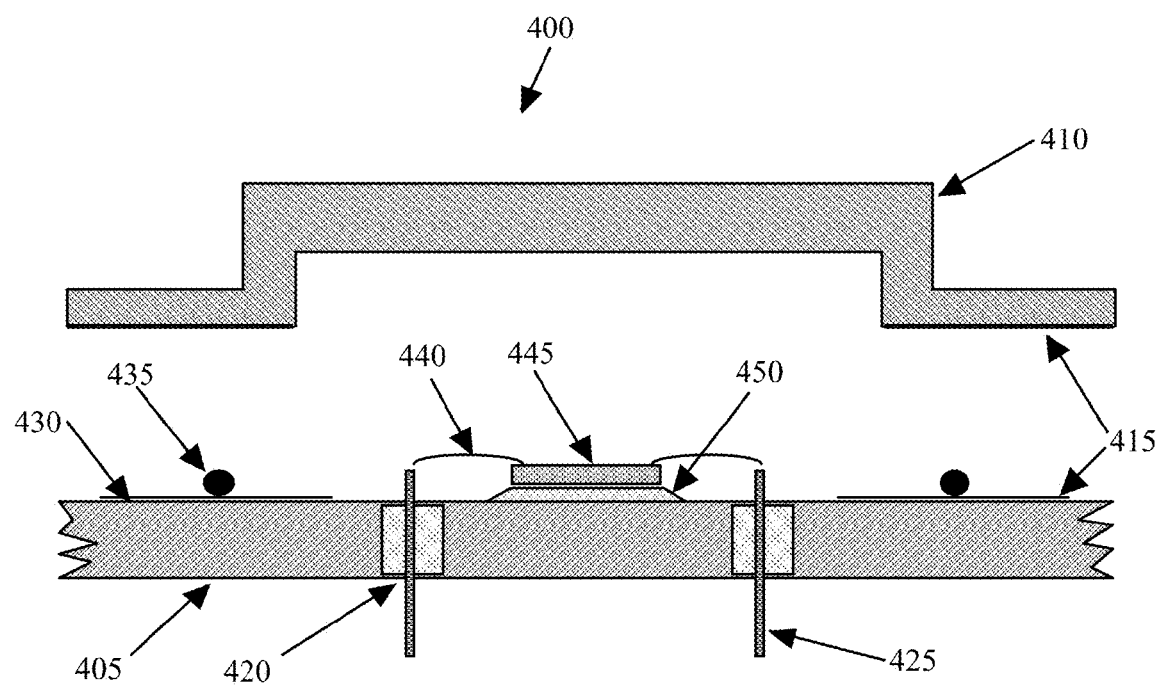
FIG. 3a and b shows a method of cold weld compression bonding a cap to a package base utilizing a mechanical shearing structure with a high aspect ratio, circular cross section perform to achieve maximum surface expansion of a gasket formed with bulk or convention thin-film processes.

The applicants prior invention, incorporated herein, utilizes a different approach to hermetic package sealing. FIG. 3a and b show in cross section a package cap which may be circular or square from top view and similar to a conventional semiconductor package cap. A matching base is shown below the cap in FIG. 3a and in rough alignment with the cap. Cap and base are prepared separately but are of the same metal material or if of different material the Thermal Coefficient of Expansion (TCE) must be closely matched. An exemplary material for cap and base is the steel alloy Kovar. Stainless steels or other formable but refractory metals can also be used. The cap is formed by stamping or machining. An optional knife or shearing edge may run continuously around the rim of the cap and is intended to enhance the surface expansion and deformability of the cold weld material. The knife or shearing edge may take other mechanical forms and shapes which are intended to optimize the solder preform surface expansion.

The base shown in FIG. 3 may be, for example, a conventional semiconductor type metal base, glass, a ceramic substrate, or the MEMS wafer itself, having insulated electrical via feedthrus with the MEMS die connected to the feedthrus by wire bonding. If the die are attached to a separate base, which offers more latitude for external connections, then the attachment material can be epoxy between the die and package base. The MEMS can be released before or after the die is attached to the package base.

The peripheral area of the base may be plated or clad with a substrate seal metallization layer of, for example, copper, gold or tin alloy, which is sealed hermetically to the base or formed as a precursor gasket. An adhesion metallization layer may be used to strengthen the adhesion of this layer to the base. A bump seal structure, narrower than the metallization layer, may be formed on the substrate seal metallization layer. If axial input/output connections for electrical, optical and other interactions are desired, then they may be formed during or before the substrate metallization, which may be subsequently planarized to ensure an even seal. Input/output connections may also be built into lower levels of the base and directed up to the cavity for connection to the device with through vias. Multi-layer low temperature co-fired ceramic or silicon wafers with a top insulting layer over lower metallization layers are examples of this kind of base.

The cap shown in FIG. 3 also is provided with a precursor metallization layer which will match the position and shape of the substrate metallization layer. The cap metallization layer is made of any material with which it is possible to form a cold weld with the substrate metallization layer and optional substrate bump seal structure. The precursor metallization layers are however typically of the same composition as the solder preform. The cap can be, for example, metal, glass or ceramic, expansion matched with the base. In the case of optical MEMS, it can have the optical window prepared in the cap frame. If needed, a getter can be built into the cap or flashed onto the cap in a separate chamber.

Referring to the detail in FIG. 3a a package base 405 is shown with MEMS die 445 attached to the base with bonding layer 450. Electrical wire bonds 440 are connected between die 445 and the electrical feedthrus 425. Electrical feedthrus 425 are insulated from the package base 405 by insulators 420 as in conventional prior art. Both cap and base are prepared with metallization 415 and consist of an adhesion layer of chrome followed by a layer of solderable metal. The layers 415 may be deposited by conventional Physical Vapor Deposition (PVD). A final top layer of 415 consists of a deposited layer of the cold weld material of choice, which may be identical with the preform or other gasket of cold weld material 435. Indium and indium alloys have been used but the low yield strength of indium generally requires that auxiliary force retention means be employed to avoid possible accidental separation of cap from base during the life of the package. Other materials such as copper and gold and tin alloys can also be used at higher pressures. The preform or other gasket 435 is shown to have a circular cross section and equivalent high aspect ratio enabling a very high degree of deformation and surface expansion, thus material flow, during the compression bonding step. Other cross sectional profiles are possible where an even greater degree of material flow and surface expansion is possible. Also, structures such as knife edge 460 fabricated into the package cap and base are possible where the design is intended to greatly enhance the metal preform flow and surface expansion.

Figure 3B:
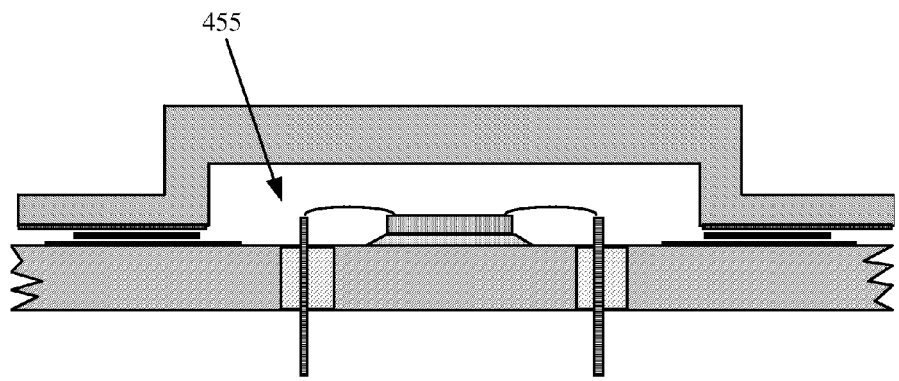

Referring to FIG. 3b the package cap is shown in intimate and hermetic contact with the package base with cold weld preform deformed to a flat washer structure as a result of high pressure from the bonding head. Space 455 now contains the MEMS device hermetically sealed from the outside atmosphere with the prebonding atmosphere trapped within the cavity 455.

Higher melting point (MP) In bearing solders (with for example Pb, Sn, Ag, Cu or Au) may also be used for package seal metallization and preform, which will allow the seal to tolerate higher temperatures and provide high enough yield strength between cap and base so as to avoid auxiliary force retention means. These materials may also be plated and thus applied to MEMS devices at the wafer scale using the same processes that are employed in focal plane array technology.

While cold welding pressures as high as 1.5 million PSI have been suggested for copper cold welds, the pressure actually used can be much lower by exploiting the energy generated at the bond interface due to friction and metallic bond breaking when high levels of shear forces are generated. The base and cap may therefore use knife or sliding edges to enhance such shear forces and material surface expansion.

Aluminum, copper, gold and other materials are highly deformable well below their cold weld pressures. The base and cap metallizations can therefore use thin layers of low tensile stress materials applied to weld interfaces as a cold weld bonding aid. Such interface materials may allow the use of aluminum, copper or gold gasket materials on silicon at the wafer scale.

Figure 4A:
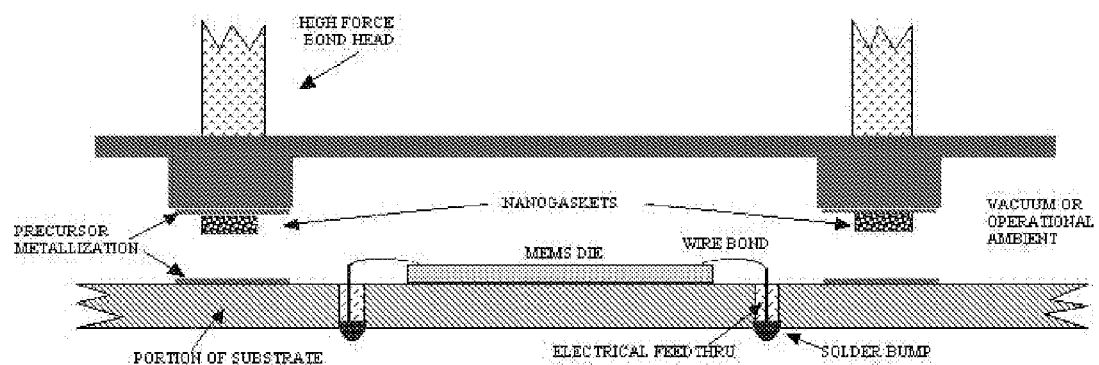
FIG. 4a shows a method of cold weld compression bonding a cap to a package base utilizing a metallic nanoparticle gasket according to the present invention.

FIG. 4 shows the method of the present invention, in which a metallic nanoparticle gasket 436 is used as the sealing gasket, thereby lowering the pressure needed to effect a hermetic seal at a given temperature. Nanoparticles of various metals or alloys may be used for the nanoparticle gasket, including Al, Sn, Au, Ag and Cu.

Figure 4B:
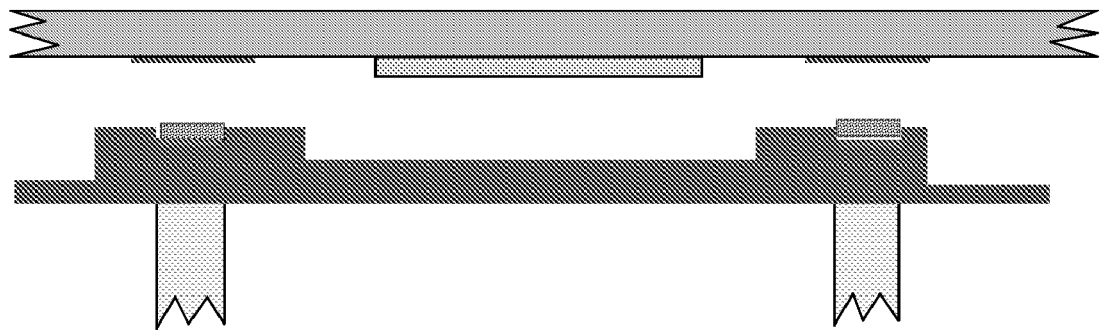
FIG. 4b shows an exemplary mechanical structure for containing the metallic nanoparticle gasket and enhancing the flow of metal during the compression operation.

The present method may be used with metallic nanoparticles having a maximum dimension, such as the radius of a spherical nanoparticle, of under 200 nm. An exemplary range for spherical Ag nanoparticles is 5 nm to 50 nm. Hermetic seals may be effected with gaskets of Ag nanoparticles having mean radii of 35 nm at about 100 MPa. The thermo-physical mechanisms by which the and grain boundary sliding. The present method may be effected with or without the use of the precursor metallization shown in FIG. 4. For example, a silane treatment of the nanoparticles may be used to form a silicon coating that will bond directly to a silicon base or cap wafer. FIG. 4b shows an exemplary trench structure, in this case on the cap wafer, that can be used to contain the gasket and enhance metal flow during the compression operation. FIG. 4b also shows a solid metal structure 437 which can be used to press the particles into the trench or other cavity and help ensure deformation and flow of the metal particles.

The nanoparticles may be created and prepared outside the sealing chamber or in an environment which is hermetically coupled to the sealing chamber. In the former case, the nanoparticles may be made using a wide range of methods known in the art, including wet chemical processes such as sol-gel, chemical precipitation and colloidal chemistry; combustion methods such as the several varieties of spray pyrolysis; evaporation/condensation methods; plasma processes; high energy milling; and mechano-chemical synthesis. Other methods have been developed to combine particles or keep them dispersed or coat them to yield specific properties. Once the particles are made, a further variety of methods for forming them into the nano-structured gasket lines of the present invention, including ink-jet printing, electrophoretic deposition, electrostatic deposition and simple settling. It is desirable to keep the particles free of oxides or surface contamination. This may be effected by various means, such as evaporation of a carrier solution for the particles, including heat-assisted evaporation in the case of a gasket formed on the package cap or cap substrate; vapor etching; or plasma or chemical etching of the formed gaskets. A number of processes may be used to formed the particles into the gasket lines. These include photolithography, the creation of trenches or other structures to receive and contain the particles, and the attraction of the particles to pre-formed lines, for example by electrophoresis.

Figure 5:
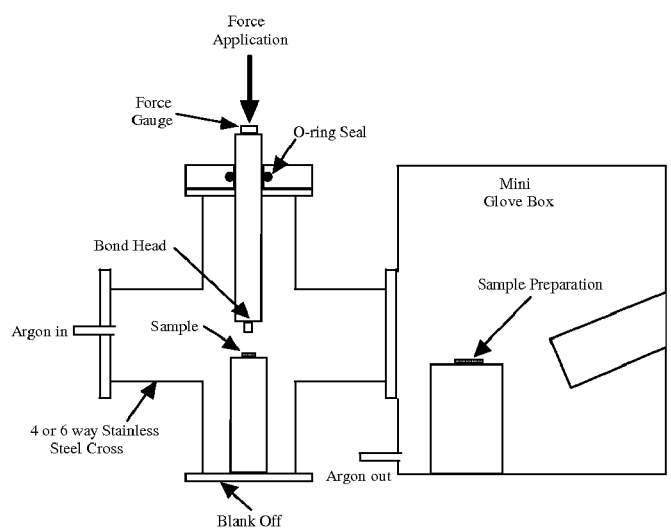
FIG. 5 shows a mechanism for in situ generation of metallic nanoparticles and their application as a nano-structured gasket according to the present invention.

The particles may also be formed in an environment which is hermetically coupled to the chamber in which the compression sealing operation takes place. This helps to ensure to ensure the cleanliness of the particles. An example of this approach is the use of cluster tool format 500, shown in FIG. 5, in which the particles are synthesized in one section 501 and formed into the gaskets on base or cap structure, which may be a full wafer, in another section 502 before being introduced to compression sealing section 503. In situ nanoparticle synthesis mechanism 510 is connected to filter section 515 which allows only those particles below a pre-determined size to be introduced to the next section via conduit 520. Exemplary methods of in situ nanoparticle synthesis include pulsed plasma and laser ablation of microparticles in vacuum. In situ synthesized nanoparticles may be formed into the gasket lines by various means. An exemplary method is the use of a differential pressure nozzle structure in which the vacuum level of section 501 or particle synthesis section 510 is kept at a lower pressure than gasket forming section 502 containing nozzle 525, the pressure difference forcing the particles through conduit 520 and out nozzle 525. Nozzle 525 or the base or cap structures 530 can be moved by positioning mechanism 540 to effect formation of the gasket lines. Base or cap structure 530 is then transported into sealing section 503 where it is aligned with opposite member (base or cap) 535 and the two are cold weld sealed by the force of bond head 560 pressing against stationary platen 550. The environment of sealing section 503, such as vacuum or rarified gas, is thereby permanently captured inside the resulting package or packages.

Figure 6:
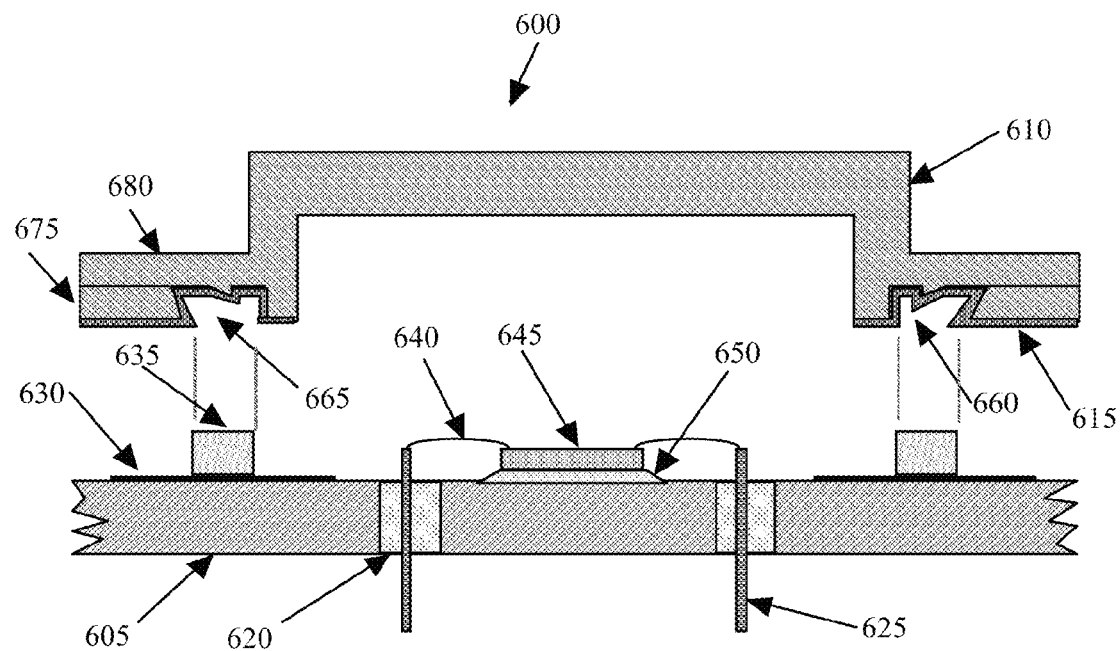
FIG. 6 shows another exemplary mechanical structure for containing the metallic nanoparticle gasket and enhancing the flow of metal during the compression operation, in this case a re-entrant cavity which also provides an additional retention mechanism for keeping base and cap together over the life of the sealed device.
Figure 6:
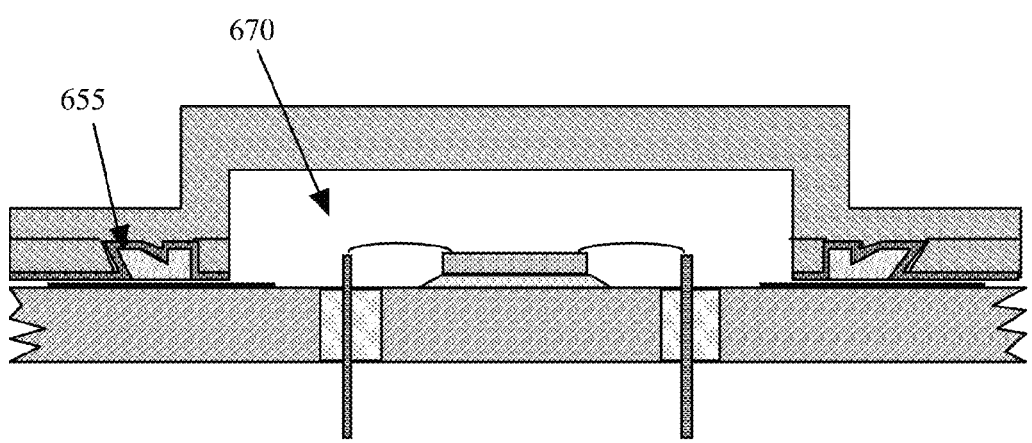

Applying caps to arrays of MEMS devices that have been released at the wafer scale is desirable since the individual die can be singulated by cutting between the sealed devices. This avoids any cutting debris from interfering with the mechanical integrity of the microscopic mechanical parts of the active MEMS devices. The use of mechanical structures formed on the wafer can assist in containing the metallic nanoparticle gasket and enhancing the flow of metal during the compression operation, as well as provide a re-entrant cavity which serves as an additional retention mechanism for keeping base and cap together over the life of the sealed device. As an example of wafer-scale sealing, FIG. 6a shows in cross section a package cap 610 and base 605 with MEMS die 645 attached to the base by conventional means. Substrate 605 is part of an extended substrate containing many MEMS devices which have been released at the wafer scale. As part of the fabrication sequence for the MEMS devices 645, layer 630 has been applied to substrate 605 using, for example, Physical Vapor Deposition (PVD). This layer may consist of two separate layers applied sequentially. The bottom layer may be an adhesion layer of, for example, chrome with thickness of 500 angstroms followed by a tin alloy layer nominally 1 micron thick. Nanoparticle gasket 635 is formed on top of layer 630. Package cap 610 may be fabricated in two parts. In this case, the primary part 680 is stamped to the desired shape, then an annular ring piece 675 is fabricated and brazed to piece 680 so as to form a substantial re-entrant cavity 665 in that portion of the cap that will accept the cold weld material. In addition, a cold-weld flow structure 660 may be added to cap part 680 to enhance the surface flow and surface expansion of the cold weld material. Layer 615 may be applied to the lower face of the cap assembly by plating and may consist of a nickel strike of about 50 millionths thickness followed by a plating of the cold weld material used on the package base. Upon bonding the cap to the base as shown in FIG. 6b the cold weld material is forced up into the re-entrant cavity 660 with the excess squeezed out laterally, thus locking the cap to the base. If the yield strength of the cold weld material is sufficiently high, the cap will be adequately secured to the base.

In single-die sealing, cap and base are introduced into a chamber at room temperature where the ambient is maintained at vacuum, rarefied gas or other ambient desired in the final micropackage. The chamber, which may be part of a complex sealing system, is equipped with a high force compression bonder with a die bonding head. Alignment of cap to base may be achieved using an indexing X-Y stage to move the base under the cap. Sufficient force is then applied between cap and base to form a cold weld between the cap and base metallizations and thus seal the device at room temperature. An automated system can gang bond arrays of released MEMS devices sequentially. The technique allows an array of caps to be fabricated that will register with the MEMS device array, negating the need to handle individual package caps.

In wafer-scale sealing, MEMS devices may be released and electrically probed for functionality before introduction to a sealing chamber, or inside a compartment of a sealing chamber. Caps, such as those described above, are prepared as either individual device caps or in a wafer-level cap array in which individual caps have been formed, for example by stamping or etching. The wafer and the caps are introduced into the sealing chamber. The wafer is supported by a firm plate on its under side. Sealing of the caps to the bases is then accomplished as described above. Caps may be attached in sequence to the individual die on the substrate. They may be held in a bond-head fixture and gang-bonded in sections or all at once.

With either single-die or wafer-scale cold weld compression bonding as disclosed herein, the bonding process may be facilitated, and the necessary pressures thereby lowered, by the application of electrical fields between base and cap structures. Fields of sufficient strength cause metal migration between the base and cap metallization layers.

The present invention is well adapted to carry out the objects and attain the ends and advantages mentioned as well as other inherent therein. While a present embodiment of the invention has been given for the purpose of disclosure, numerous changes or alterations in the details of construction and steps of the method will be readily apparent to those skilled in the art and which are encompassed within the spirit and scope of the invention.

What is claimed is:

1. A method for hermetically sealing a device inside a micro- or nano- package, comprising the steps of:
    sealing a package base and cap with a metallic sealing gasket, wherein said metallic sealing gasket is between said package base and said package cap, wherein said sealing is accomplished with a compressive force sufficient to effect a permanent hermetic cold-weld seal without the addition of heat;
    wherein said sealing is accomplished within a sealing chamber having a sealing chamber environment, and wherein at least a portion of said sealing chamber environment is captured within said micro- or nano- package; and
    wherein said metallic sealing gasket is comprised of metallic nanoparticles with an average diameter below 200 nanometers, wherein said permanent hermetic cold-weld seal is accomplished without the need for additional holding force structures or sealants.

2. The method of claim 1 wherein said device is a MEMS or NEMS.

3. The method of claim 1 further comprising the step of providing a precursor material on both said package cap and package base in the area where said cold weld seal is to be accomplished.

4. The method of claim 1 further comprising the step of providing a reentrant cavity or other mechanical design structure in either said package base or package cap such that the metallic sealing gasket is confined to the sealing perimeter area.

5. The method of claim 1 further comprising the step of providing a reentrant cavity or other mechanical design structure in either said package base or package cap such that a metal surface flow of said metallic sealing gasket is enhanced as said package base and package cap are compressed together.

6. The method of claim 1 further comprising the step of enhancing a metal surface expansion and a flow of said metallic sealing gasket by moving said package base and package cap laterally in relation to each other as they are compressed together.

7. The method of claim 1 further comprising the step of forming said device as an integral portion of said package base or package cap.

8. The method of claim 1 further comprising the step of depositing a getter on at least one or more of said package cap, package base, and said device, within said sealing chamber environment and without opening said sealing chamber.

9. The method of claim 1 further comprising the step of sealing a plurality of said devices on a common base substrate with an array of caps, said caps being either separated or joined together.

10. The method of claim 1, wherein said sealing chamber environment is comprised of at least one or more of inert gas, rarified gas, and vacuum ambient environment.

* * * * *